(12) United States Patent
Ko et al.

(10) Patent No.: US 8,022,538 B2
(45) Date of Patent: Sep. 20, 2011

(54) BASE PACKAGE SYSTEM FOR INTEGRATED CIRCUIT PACKAGE STACKING AND METHOD OF MANUFACTURE THEREOF

(75) Inventors: WonJun Ko, Sungnam-Si (KR); NamJu Cho, Uiwang-si (KR)

(73) Assignee: STATS ChipPAC Ltd., Singapore (SG)

( * ) Notice: Subject to any disclaimer, the term of this patent is extended or adjusted under 35 U.S.C. 154(b) by 174 days.

(21) Appl. No.: 12/272,747

(22) Filed: Nov. 17, 2008

(65) Prior Publication Data
US 2010/0123247 A1 May 20, 2010

(51) Int. Cl.
*H01L 23/28* (2006.01)
*H01L 23/31* (2006.01)
*H01L 21/56* (2006.01)

(52) U.S. Cl. ............ 257/730; 257/787; 257/E23.123; 257/E21.502

(58) Field of Classification Search ............ 257/737, 257/738, 730, E23.123, E21.502, 787; 438/126, 438/127, 113
See application file for complete search history.

(56) References Cited

U.S. PATENT DOCUMENTS

| | | | |
|---|---|---|---|
| 4,946,633 A | 8/1990 | Saeki et al. | |
| 5,535,101 A * | 7/1996 | Miles et al. | 361/808 |
| 5,708,300 A * | 1/1998 | Woosley et al. | 257/730 |
| 6,177,724 B1 * | 1/2001 | Sawai | 257/701 |
| 6,262,490 B1 | 7/2001 | Hsu et al. | |
| 6,338,813 B1 | 1/2002 | Hsu et al. | |
| 6,395,159 B2 * | 5/2002 | Matsuo et al. | 204/427 |
| 6,396,159 B1 * | 5/2002 | Shoji | 257/788 |
| 6,515,356 B1 * | 2/2003 | Shin et al. | 257/678 |
| 6,552,428 B1 * | 4/2003 | Huang et al. | 257/706 |
| 6,717,279 B2 * | 4/2004 | Koike | 257/787 |
| 6,798,049 B1 * | 9/2004 | Shin et al. | 257/678 |
| 6,867,487 B2 * | 3/2005 | Huang et al. | 257/687 |
| 6,916,683 B2 * | 7/2005 | Stephenson et al. | 438/108 |
| 7,009,293 B2 * | 3/2006 | Hashimoto | 257/730 |
| 7,122,406 B1 * | 10/2006 | Yilmaz et al. | 438/123 |
| 7,147,447 B1 * | 12/2006 | Takahashi | 425/89 |
| 7,193,161 B1 * | 3/2007 | Takiar et al. | 174/521 |
| 7,268,303 B2 * | 9/2007 | Ashida | 174/260 |
| 7,394,148 B2 | 7/2008 | Karnezos | |
| 7,405,145 B2 * | 7/2008 | Khan et al. | 438/613 |
| 7,446,423 B2 * | 11/2008 | Sakai et al. | 257/783 |
| 7,573,718 B2 * | 8/2009 | Uzuka et al. | 361/742 |
| 7,608,921 B2 * | 10/2009 | Pendse | 257/686 |
| 7,659,623 B2 * | 2/2010 | Watanabe et al. | 257/737 |
| 7,687,803 B2 * | 3/2010 | Takagi et al. | 257/48 |
| 7,714,453 B2 * | 5/2010 | Khan et al. | 257/787 |
| 2004/0046241 A1 * | 3/2004 | Combs et al. | 257/678 |
| 2007/0200210 A1 * | 8/2007 | Zhao et al. | 257/676 |
| 2007/0290376 A1 * | 12/2007 | Zhao et al. | 257/787 |
| 2008/0057622 A1 | 3/2008 | Fan | |

* cited by examiner

*Primary Examiner* — Mary Wilczewski
(74) *Attorney, Agent, or Firm* — Mikio Ishimaru

(57) ABSTRACT

A method of manufacture of a base package system includes: forming a substrate strip assembly including: providing a substrate strip having ball lands, mounting an integrated circuit on the substrate strip, and molding a finger structure, having a knuckle region, on the integrated circuit; and singulating a substrate from the substrate strip assembly.

20 Claims, 5 Drawing Sheets

BASE PACKAGE SYSTEM FOR INTEGRATED CIRCUIT PACKAGE STACKING AND METHOD OF MANUFACTURE THEREOF

TECHNICAL FIELD

The present invention relates generally to integrated circuit packaging, and more particularly to a system for a base package for package on package stacking.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Many technologies have been developed to meet these requirements. Some of the research and development strategies focus on new package technologies while others focus on improving the existing and mature package technologies. Research and development in the existing package technologies may embody a number of different directions.

One proven way to reduce cost is to use package technologies with existing manufacturing methods and equipments. Unfortunately, the reuse of existing manufacturing processes does not typically result in the reduction of package dimensions.

In response to the demands for improved packaging, many innovative package designs have been brought to market. The multi-chip module has achieved a prominent role in reducing the board space used by modern electronics. However, multi-chip modules, whether vertically or horizontally arranged, can also present problems because they usually must be assembled before the component chips and chip connections can be tested. When die are mounted and connected to a substrate, the die and connections can be tested, and only known-good-die ("KGD") free of defects are then assembled into larger circuits.

Other assembly and manufacturing defects may be encountered when the substrate has a package molding compound applied or when the individual devices are singulated from a larger strip containing multiple devices. In some cases, the package molding compound may become extruded onto the surface of the substrate beyond the intended profile. This may contaminate electrical contacts intended for further assembly or test. There may also be complications during the singulation process that can cause a delamination of the package molding compound from the die surface. The delamination can cause the electrical connections between the die and the substrate to break.

Several packaging techniques may stack multiple integrated circuit dice in a single package or form a package-in-package (PIP) stack or a combination thereof. Other approaches include package level stacking or package-on-package (POP). These techniques include stacking of two or more packages to form a single device. Assembly process yields are less of an issue since each package can be tested prior to assembly, allowing KGD to be used in assembling the stack. However, stacking integrated devices, package-in-package, package-on-package, or combinations thereof have assembly process difficulties caused by some packages having contamination on the electrical connections or broken electrical connections due to singulation stresses and delamination.

Thus, a need still remains for a base package system for integrated circuit package stacking providing low cost manufacturing, improved yields, reduction of integrated circuit package dimensions, and flexible integration configurations. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a base package system including: forming a substrate strip assembly includes: providing a substrate strip having ball lands, mounting an integrated circuit on the substrate strip, and molding a finger structure, having a knuckle region, on the integrated circuit; and singulating a substrate from the substrate strip assembly.

The present invention provides a base package system including: a substrate having ball lands; an integrated circuit mounted on the substrate; and a molded package body, having a knuckle region, on the integrated circuit.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
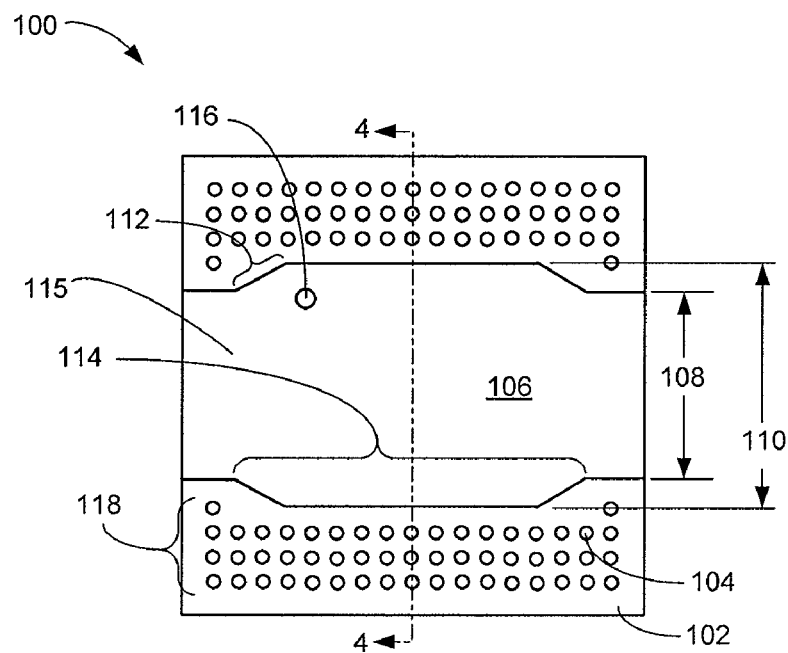
FIG. 1 is a top view of a base package system for integrated circuit package stacking in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the long dimension of a substrate strip, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes stamping, forging, patterning, exposure, development, etching, cleaning, and/or removal of the material or laser trimming as required in forming a described structure.

Referring now to FIG. 1, therein is shown a top view of a base package system 100 for integrated circuit package stacking in an embodiment of the present invention. The top view of the base package system 100 depicts a substrate 102 having ball lands 104 patterned around a molded package body 106. The molded package body 106 may have a first dimension 108 at the edge of the substrate 102 and a second dimension 110, larger than the first dimension 108, on the center of the substrate 102.

A transition region 112, such as a slope between the first dimension 108 and the second dimension 110, may form the molded package body 106. The area of the molded package body 106 that includes the second dimension 110 and the transition region 112 on either side near the central region of the substrate 102 may be called a knuckle region 114. The molded package body 106 has a planar top surface 115 across the entire molded package body 106. The knuckle region 114 has an expanded dimension between the sides of the molded package body 106 as compared to regions away from the central region of the substrate 102. The knuckle region 114 of the molded package body 106 is molded over and on an integrated circuit (not shown). An orientation indicator 116 may be used during the assembly process to identify the pin numbers of the ball lands 104.

The ball lands 104 may be formed in a contact array 118. The contact array 118 may be positioned adjacent to the boundary of the molded package body 106. The shape and position of the contact array 118 is an example only and the actual shape and position may differ. More than one of the contact array 118 may be present on the substrate 102. The contact array 118 may contain a different number of the ball lands 104 than is shown.

It has been discovered that the transition region 112, when properly designed, may eliminate the occurrence of contamination of the ball lands 104 due to flash from the molding process. Flash may be caused when a molten liquid epoxy molding compound seeps between a mold chase and the substrate 102, forming a solid contaminant on or near the ball lands 104. The transition region 112 may provide a reduction in pressure and temperature in the epoxy molding compound as the molten liquid epoxy molding compound flows from the first dimension 108 to the second dimension 110. The cooling of the molten liquid epoxy molding compound causes it to solidify at the mold boundary and provide a seal that prevents the flash formation.

It has been further discovered that the transition region 112, when properly designed may eliminate the occurrence of delamination, between the molded package body 106 and the integrated circuit (not shown) that is mounted on the substrate 102, during the singulation process. The stress caused by the sawing or shearing may be redirected and diffused in the transition region 112. This redirection and diffusion may reduce the forces, applied to the interface between the molded package body 106 and the integrated circuit (not shown), to a level that can not cause delamination damage.

Figure 4:
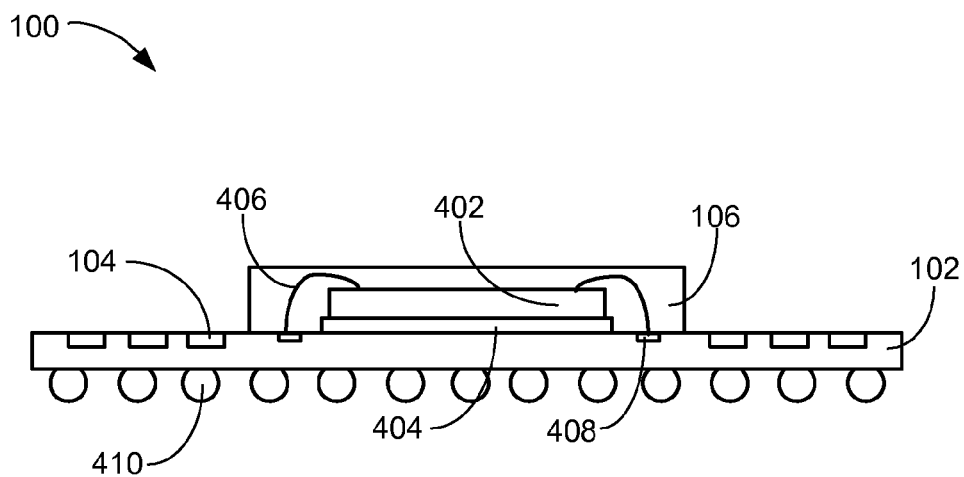
FIG. 4 is a cross-sectional view of the base package system along the section line 4-4 of FIG. 1.

A section line 4-4 may indicate the position and direction of view for the cross-sectional view of FIG. 4. The position and number of the ball lands 104 is for example only and the number and position in other embodiments of the present invention may differ. The relative position of the transition region 112 is an example. Certain criteria for the transition region was discovered to optimize the reliability of the molded package body 106

Figure 2:
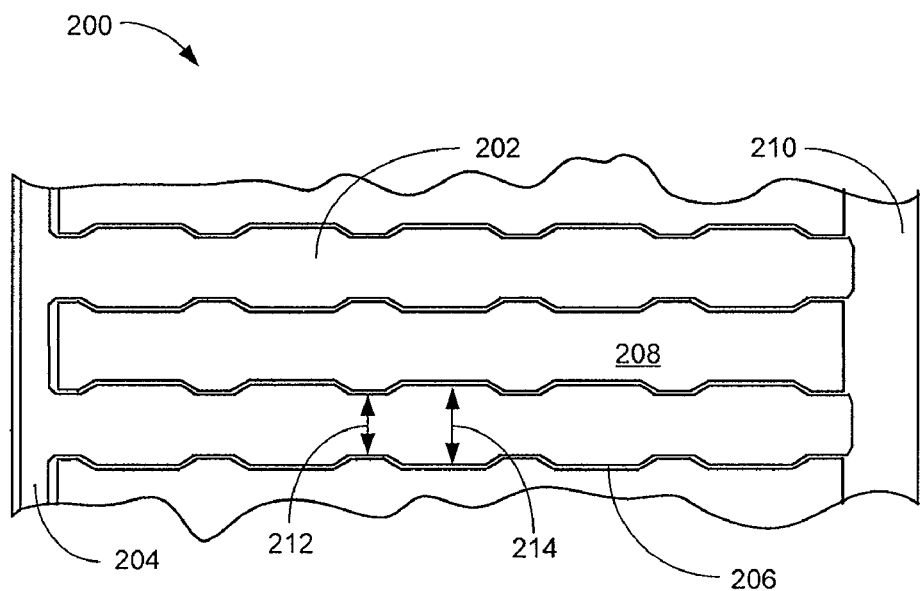
FIG. 2 is a bottom view of a segment of a finger mold chase for implementing the base package system.

Referring now to FIG. 2, therein is shown a bottom view of a segment of a finger mold chase 200 for implementing the base package system 100, of FIG. 1. The bottom view of a segment of the finger mold chase 200 depicts a finger mold cavity 202 adjoining a molding compound channel 204. A chase sealing region 206 may be formed around the finger mold cavity 202. The chase sealing region 206 may be machined to provide a coplanar surface across the finger mold chase 200.

A relief region 208 may be machined adjoining the chase sealing region 206. The relief region 208 may have an elevation recess on the order of 10 μm from the chase sealing region 206. The relief region 208 may allow a slight cooling to occur when an epoxy molding compound is pressed into the finger mold cavity 202. A chase body 210, that is coplanar with the chase sealing region 206, may provide a vent (not shown) for the exhaust of air that may be trapped when the finger mold chase 200 is pressed against a substrate strip (not shown).

The shape of the finger mold cavity 202 is an example only and the shape may be different if a different number of the base package systems 100 are to be formed. The common characteristic is a finger width 212 and a knuckle width 214 in the finger mold cavity 202 that may form the first dimension 108, of FIG. 1, and the second dimension 110, of FIG. 1, respectively.

Figure 3:
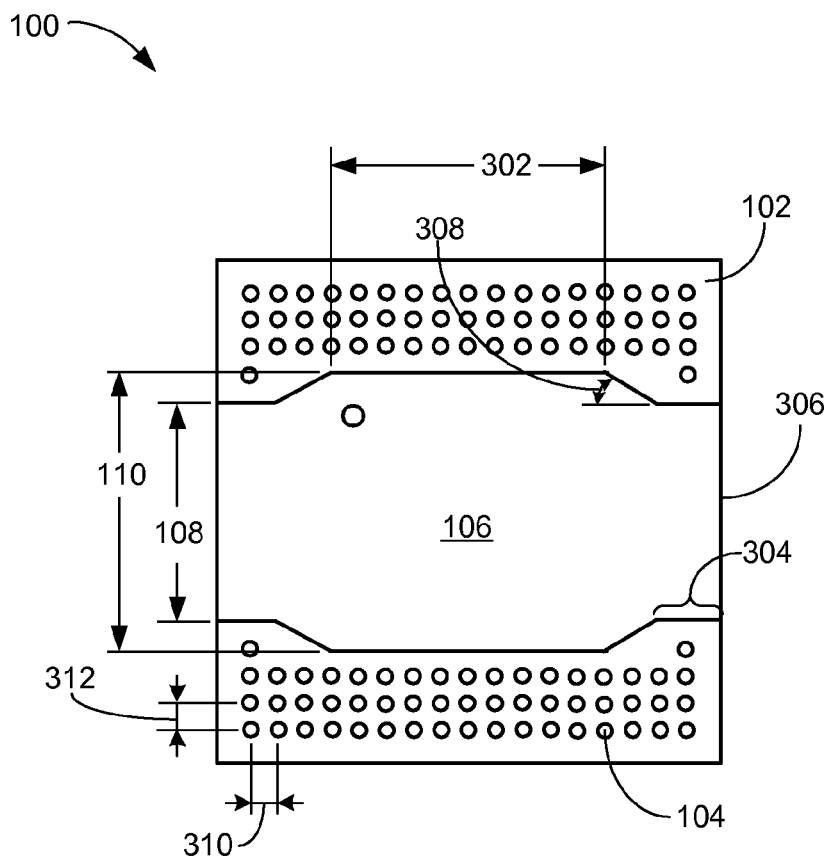
FIG. 3 is a dimensional view of the base package system of FIG. 1.

Referring now to FIG. 3, therein is shown a dimensional view of the base package system 100 of FIG. 1. The dimensional view of the base package system 100 depicts the substrate 102 having the molded package body 106 formed thereon. The molded package body 106 may have the first dimension 108 and the second dimension 110. A cover dimension 302 may be sufficiently large to overlay the circuits (not shown) that may be mounted on the substrate 102. A typical measurement for the cover dimension 302 may be in the range of 6.48 mm to 6.58 mm, though other dimensions are possible. A finger length 304 may extend from an edge 306 of the substrate 102, having a typical range between 1.5 mm and 4.5 mm.

A connection angle 308 may be formed between the cover dimension 302 and the finger length 304. The connection angle 308 may be in the range of greater than 0 to less than 90 degrees and is nominally in the range of 25 to 35 degrees. The connection angle 308 provides the distribution of forces that may be applied during the singulation process. As the force is distributed over a larger area, its magnitude is reduced below the level that may cause delamination between the molded package body 106 and the circuits (not shown) that may be mounted on the substrate 102.

It has been discovered that the connection angle 308 while set to the nominal angle provides an optimal redistribution of the forces developed during the singulation process. Either a lesser angle or a greater angle may provide less protection from delamination. It was also discovered that the connection angle 308 may be changed in order to minimize warping of the substrate 102.

The ball lands 104 positioned around the molded package body 106 may be have a column space 310 and a row space 312 that provide sufficient spacing for coupling a ball grid array (not shown) over the molded package body 106. While the preferred embodiment may couple to the ball grid array, other devices may be configured for attachment as well. Those devices may include the ball grid array, discrete components, leaded packages, or a combination thereof.

Referring now to FIG. 4, therein is shown a cross-sectional view of the base package system 100, along the section line 4-4 of FIG. 1. The cross-sectional view of the base package system 100 depicts the substrate 102 having the ball lands 104 arranged around the molded package body 106. An integrated circuit 402 may be mounted on the substrate 102 by an adhesive 404. An electrical interconnect 406 may couple the integrated circuit 402 to a bonding pad 408 on the substrate 102. System interconnects 410 may be attached to the substrate 102 for forming an electrical connection between the next level system (not shown), the integrated circuit 402, the ball lands 104, or a combination thereof.

While the integrated circuit 402 is shown to be a wire bond type, this is an example only and a flip chip integrated circuit or a stack of multiple integrated circuits may be mounted on the substrate 102. The number and position of the system interconnects 410 is an example also and may differ.

Figure 5:
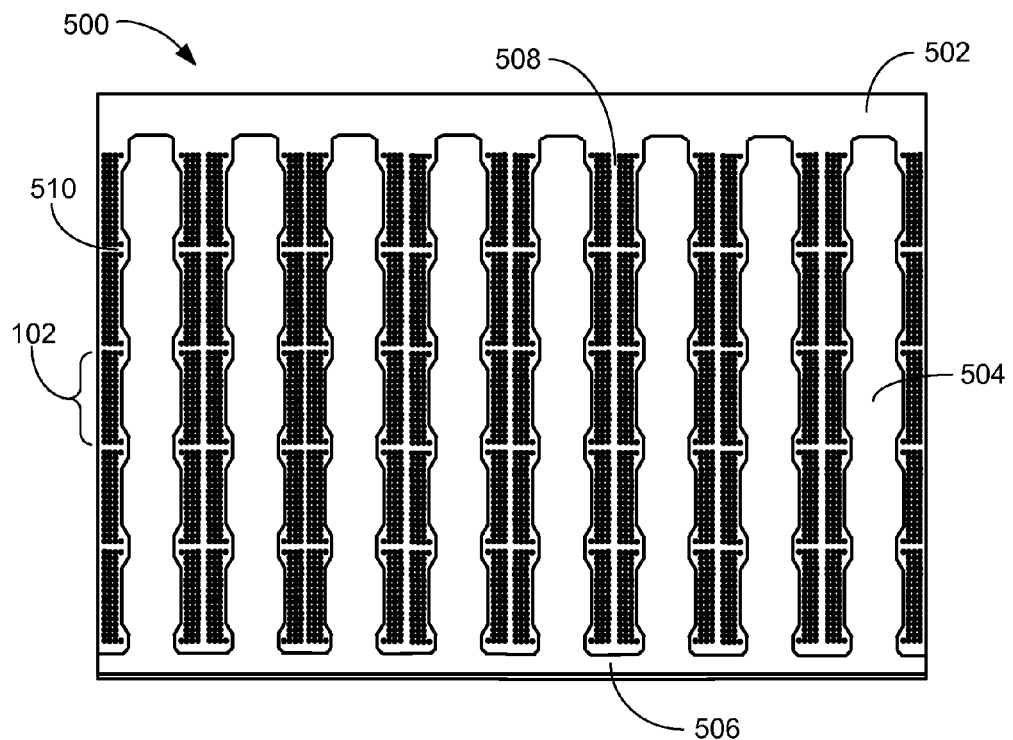
FIG. 5 is a top view of a substrate strip assembly in a vertical finger molding step of manufacturing.

Referring now to FIG. 5, therein is shown a top view of a substrate strip assembly 500 in a vertical finger molding step of manufacturing. The top view of the substrate strip assembly 500 depicts a substrate strip 502 including multiple copies of the substrate 102 patterned on the substrate strip 502. Finger structures 504 may have been molded on the substrate strip 502 in a vertical orientation. The finger structures 504 may extend from a distribution bar 506. The number and position of the finger structures 504 is an example only and may differ in another implementation.

The instances of the substrate 102 formed on the substrate strip 502 may be arranged in order to provide a vertical singulation channel 508 and a horizontal singulation channel 510. The instances of the substrate 102 may be separated from the substrate strip 502 during the singulation process. The separation of the substrate strip 502 may be performed by using a shear (not shown) or a saw (not shown).

Figure 6:
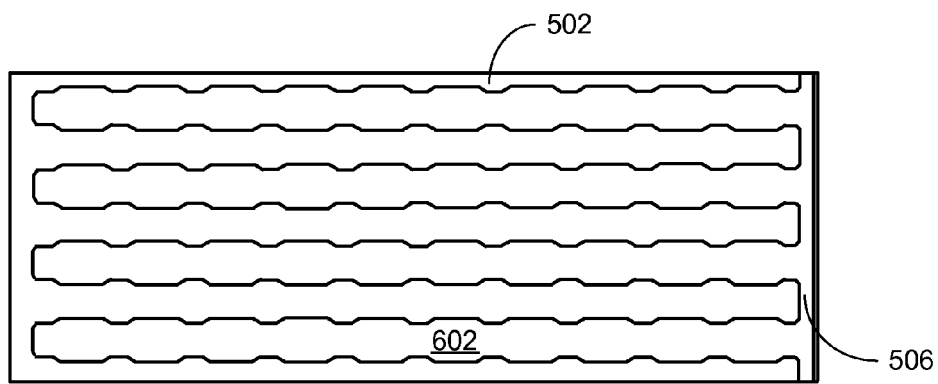
FIG. 6 is a top view of a substrate strip assembly in a horizontal finger molding step of manufacturing in an alternate embodiment of the present invention.

Referring now to FIG. 6, therein is shown a top view of a substrate strip assembly 600 in a horizontal finger molding step of manufacturing in an alternate embodiment of the present invention. The top view of the substrate strip assembly 600 depicts the substrate strip 502 having long finger structures 602 formed in the horizontal direction. As previously described the number of the instances of the substrate 102 formed in the substrate strip 502 may vary. As well, the orientation of the instances of the substrate 102 may all be rotated by 90 degrees relative to the drawing of FIG. 5. Some of the detail of the instances of the substrate 102 have been omitted for clarity, but are normally present.

The singulation of the substrates 102 from the substrate strip assembly 600 may occur on the vertical singulation channel 508 and the horizontal singulation channel 510. At least one of the vertical singulation channel 508 or the horizontal singulation channel 510 will pass through the area of the long finger structure 602 having the first dimension 108. The reduced amount of the molded package body 106 may allow a longer useful life of the singulation saw or shear.

Figure 7:
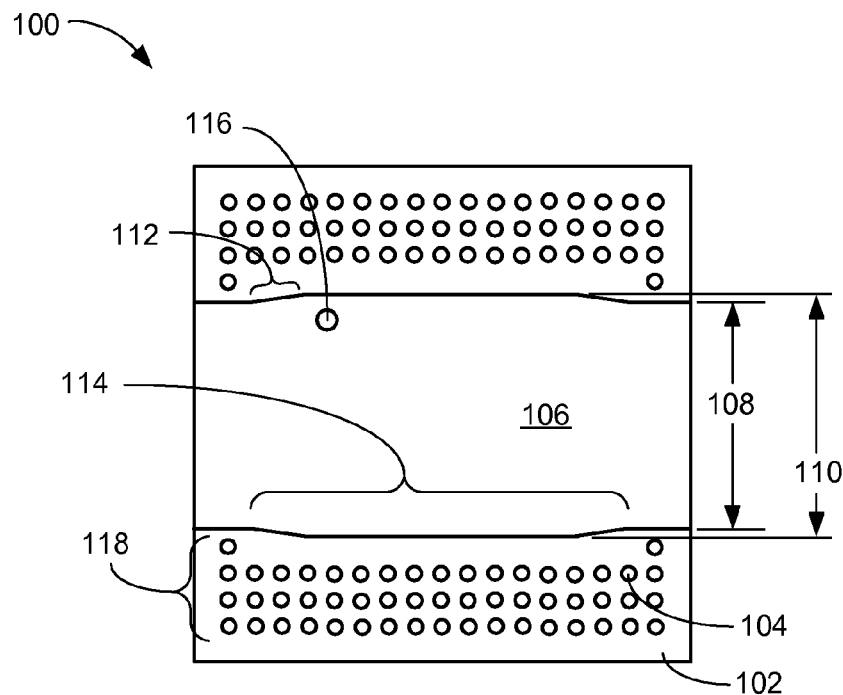
FIG. 7 is a top view of a base package system for integrated circuit package stacking in an alternative embodiment of the present invention.

Referring now to FIG. 7, therein is shown the top view of the base package system 100 for integrated circuit package stacking in an alternative embodiment of the present invention. The top view of the base package system 100 depicts the substrate 102 having the ball lands 104 patterned around the molded package body 106. The molded package body 106 may have the first dimension 108 at the edge of the substrate 102 and the second dimension 110, larger than the first dimension 108, on the center of the substrate 102.

The molded package body 106 of this embodiment may have the connection angle 308, of FIG. 3, set to greater than 0 degrees. This embodiment may be preferable to minimize warping of the substrate 102 during the manufacturing process while still providing some protection from delamination.

The transition region 112, such as a slope between the first dimension 108 and the second dimension 110, may form the molded package body 106. The area of the molded package body 106 that includes the second dimension 110 and the transition region 112 on either side may be called the knuckle region 114. The knuckle region 114 of the molded package body 106 is molded over and on the integrated circuit (not shown). The orientation indicator 116 may be used during the assembly process to identify the pin numbers of the ball lands 104.

The ball lands 104 may be formed in the contact array 118. The contact array 118 may be positioned adjacent to the boundary of the molded package body 106. The shape and position of the contact array 118 is an example only and the actual shape and position may differ. More than one of the contact array 118 may be present on the substrate 102. The contact array 118 may contain a different number of the ball lands 104 than is shown.

Figure 8:
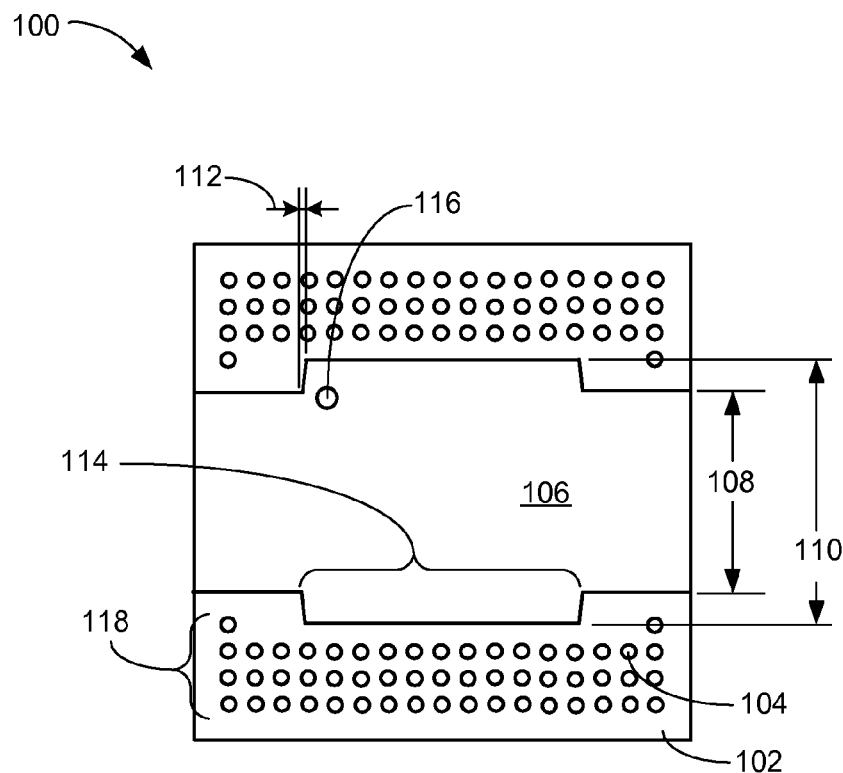
FIG. 8 is a top view of a base package system for integrated circuit package stacking in another alternative embodiment of the present invention.

Referring now to FIG. 8, therein is shown the top view of the base package system 100 for integrated circuit package stacking in another alternative embodiment of the present invention. The top view of the base package system 100 depicts the substrate 102 having the ball lands 104 patterned around the molded package body 106. The molded package body 106 may have the first dimension 108 at the edge of the substrate 102 and the second dimension 110, larger than the first dimension 108, on the center of the substrate 102.

The molded package body 106 of this embodiment may have the connection angle 308, of FIG. 3, set to less than 90 degrees. This embodiment may provide some protection from delamination while providing some minimization of warping of the substrate 102 during the manufacturing process.

The transition region 112, such as a slope between the first dimension 108 and the second dimension 110, may form the molded package body 106. The area of the molded package body 106 that includes the second dimension 110 and the transition region 112 on either side may be called the knuckle region 114. The knuckle region 114 of the molded package body 106 is molded over and on the integrated circuit (not shown). The orientation indicator 116 may be used during the assembly process to identify the pin numbers of the ball lands 104.

The ball lands 104 may be formed in the contact array 118. The contact array 118 may be positioned adjacent to the boundary of the molded package body 106. The shape and position of the contact array 118 is an example only and the actual shape and position may differ. More than one of the contact array 118 may be present on the substrate 102. The contact array 118 may contain a different number of the ball lands 104 than is shown.

Figure 9:
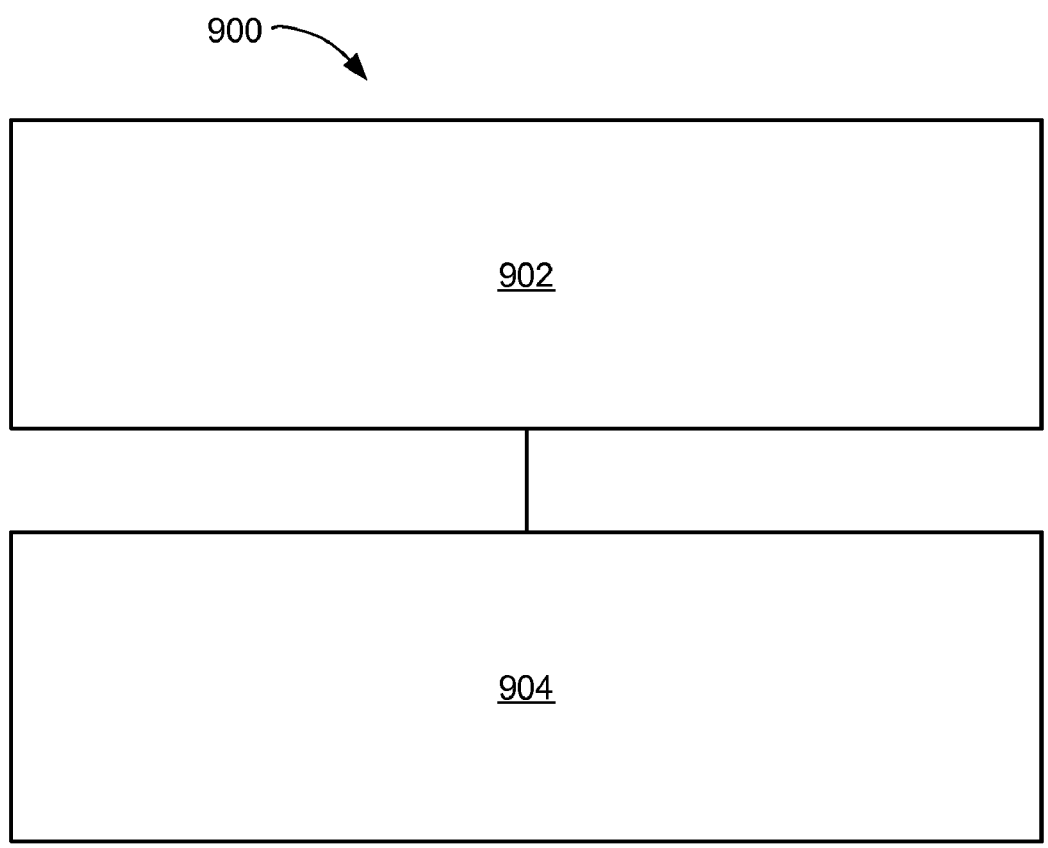
FIG. 9 is a flow chart of a method of manufacture of a base package system in an embodiment of the present invention.

Referring now to FIG. 9, therein is shown a flow chart of a method 900 of manufacture of the base package system 100 in an embodiment of the present invention. The method 900 includes forming a substrate strip assembly including: providing a substrate strip having ball lands, mounting an integrated circuit on the substrate strip, and molding a finger structure, having a knuckle region, on the integrated circuit in a block 902; and singulating a substrate from the substrate strip assembly in a block 904.

In greater detail, a method to manufacture the base package system, in a further embodiment of the present invention, is performed as follows:

1. Forming a substrate strip assembly including: providing a substrate strip having ball lands including coupling a system interconnect to the ball lands through the substrate strip, mounting an integrated circuit on the substrate strip including coupling, by an electrical interconnect, the integrated circuit, the system interconnect, the ball lands, or a combination thereof, and molding a finger structure, having a knuckle region, on the integrated circuit including encapsulating a bonding pad coupled to the electrical interconnect. (FIG. 5)
2. Singulating a substrate from the substrate strip assembly including sawing or shearing a first dimension of the finger structure for forming a molded package body. (FIG. 1)

It has been discovered that the present invention thus has numerous aspects.

A principle aspect that has been unexpectedly discovered is that the present invention may prevent the formation of flash during the molding process.

Another aspect is that the transition region between the first dimension and the second dimension may redirect and reduce the forces that may cause delamination between the molded package body and the integrated circuit during singulation.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the base package system of the present invention furnishes important and heretofore unknown and unavailable solutions, capabilities, and functional aspects for manufacturing the base package system for package-on-package development. The resulting processes and configurations are straightforward, cost-effective, uncomplicated, highly versatile and effective, can be surprisingly and unobviously implemented by adapting known technologies, and are thus readily suited for efficiently and economically manufacturing high density integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a base package system comprising:
    forming a substrate strip assembly including:
        providing a substrate strip having ball lands,
        mounting an integrated circuit on the substrate strip, and
        molding a finger structure for forming a molded package body, having a planar top surface across the entire molded package body and a knuckle region near the central region of the substrate with an expanded dimension between sides of the molded package body as compared to regions away from the central region of the substrate, on the integrated circuit; and
    singulating a substrate from the substrate strip assembly.

2. The method as claimed in claim 1 further comprising forming a transition region in the knuckle region.

3. The method as claimed in claim 1 in which providing the substrate strip having the ball lands includes:
    positioning contact arrays on the substrate strip; and
    providing a vertical singulation channel and a horizontal singulation channel between the contact arrays.

4. The method as claimed in claim 1 in which molding the finger structure includes molding a finger width and a knuckle width.

5. The method as claimed in claim 1 wherein molding the finger structure includes providing a finger mold chase having a chase sealing region that is coplanar with a chase body.

6. A method of manufacture of a base package system comprising:
    forming a substrate strip assembly including:
        providing a substrate strip having ball lands including coupling a system interconnect to the ball lands through the substrate strip,
        mounting an integrated circuit on the substrate strip including coupling, by an electrical interconnect, the integrated circuit, the system interconnect, the ball lands, or a combination thereof, and
        molding a finger structure for forming a molded package body, having a planar top surface across the entire top surface of a molded package body and a knuckle region near the central region of the substrate with an expanded dimension between sides of the molded package body as compared to regions away from the central region of the substrate, on the integrated circuit including encapsulating a bonding pad coupled to the electrical interconnect; and
    singulating a substrate from the substrate strip assembly including sawing or shearing a first dimension of the finger structure for forming the molded package body.

7. The method as claimed in claim 6 further comprising forming a transition region in the knuckle region including forming a connection angle between a cover dimension and a finger length.

8. The method as claimed in claim 6 in which providing the substrate strip having the ball lands includes:
    positioning contact arrays on the substrate strip including positioning by a column space and a row space the ball lands; and
    providing a vertical singulation channel and a horizontal singulation channel between the contact arrays including cutting a first dimension of the finger structure through the vertical singulation channel or the horizontal singulation channel.

9. The method as claimed in claim 6 in which molding the finger structure includes molding a finger width and a knuckle width including forming a transition region between the finger width and the knuckle width for preventing a delamination of the molded package body.

10. The method as claimed in claim 6 wherein molding the finger structure includes providing a finger mold chase having a chase sealing region that is coplanar with a chase body including providing a relief region adjoining the chase sealing region for cooling an epoxy molding compound.

11. A base package system comprising:
a substrate having ball lands;
an integrated circuit mounted on the substrate; and
a molded package body, having a planar top surface across the entire molded package body and a knuckle region near the central region of the substrate with an expanded dimension between sides of the molded package body as compared to regions away from the central region of the substrate, on the integrated circuit.

12. The system as claimed in claim 11 further comprising a transition region in the knuckle region.

13. The system as claimed in claim 11 wherein the substrate having the ball lands includes contact arrays positioned on the substrate adjacent to the molded package body.

14. The system as claimed in claim 11 in which the molded package body includes a first dimension at an edge of the substrate and a second dimension around the center of the substrate.

15. The system as claimed in claim 11 wherein the molded package body includes an epoxy molding compound on the integrated circuit.

16. The system as claimed in claim 11 further comprising:
a system interconnect coupled to the ball lands through the substrate; and
an electrical interconnect between the integrated circuit and a bonding pad for coupling the system interconnect, the ball lands, or a combination thereof.

17. The system as claimed in claim 16 further comprising a transition region in the knuckle region includes a finger length between an edge of the substrate and the transition region.

18. The system as claimed in claim 16 wherein the substrate having the ball lands includes contact arrays positioned on the substrate adjacent to the molded package body in which the contact arrays have a column space and a row space.

19. The system as claimed in claim 16 in which the molded package body includes a first dimension at an edge of the substrate and a second dimension around the center of the substrate includes a connection angle between the first dimension and the second dimension.

20. The system as claimed in claim 16 wherein the molded package body includes an epoxy molding compound on the integrated circuit having a first dimension connected to a second dimension by a connection angle.

* * * * *

UNITED STATES PATENT AND TRADEMARK OFFICE
CERTIFICATE OF CORRECTION

PATENT NO. : 8,022,538 B2 Page 1 of 1
APPLICATION NO. : 12/272747
DATED : September 20, 2011
INVENTOR(S) : Ko et al.

It is certified that error appears in the above-identified patent and that said Letters Patent is hereby corrected as shown below:

Column 4:
line 19, add double dashes between numbers 4-4 as follows: delete "section line 4-4 may indicate" and insert therefor --section line 4--4 may indicate--

Column 5:
lines 25-26, add double dashes between numbers 4-4 as follows: delete "line 4-4 of FIG. 1." and insert therefor --line 4--4 of FIG. 1.--

Column 8:
lines 43-44, delete "the entire top surface of a molded package" and insert therefor --the entire molded package--

Signed and Sealed this
Fifth Day of June, 2012

David J. Kappos
*Director of the United States Patent and Trademark Office*